US005799053A

United States Patent [19]
Park

[11] Patent Number: 5,799,053
[45] Date of Patent: Aug. 25, 1998

[54] HIGH-SPEED PREDECODING ADDRESS COUNTER CIRCUIT

[75] Inventor: Kee Woo Park, Ichon, Rep. of Korea

[73] Assignee: Hyundai Electronics Industries Co., Ltd., Ichon, Rep. of Korea

[21] Appl. No.: 777,197

[22] Filed: Dec. 27, 1996

[30] Foreign Application Priority Data

Dec. 31, 1995 [KR] Rep. of Korea .................. 95 72394

[51] Int. Cl.$^6$ ............................................. H03K 21/02
[52] U.S. Cl. .................. 377/26; 377/111; 377/116; 365/230.06; 365/236
[58] Field of Search .................. 377/26, 52, 111, 377/116; 365/230.06, 236

[56] References Cited

U.S. PATENT DOCUMENTS

| | | | |
|---|---|---|---|
| 4,503,525 | 3/1985 | Malik et al. | 365/222 |
| 5,117,388 | 5/1992 | Nakano et al. | 365/73 |
| 5,668,772 | 9/1997 | Hotta | 365/240 |
| 5,706,233 | 1/1998 | Ooishi | 365/230.06 |

*Primary Examiner*—Margaret Rose Wambach
*Attorney, Agent, or Firm*—Reid & Priest LLP

[57] ABSTRACT

A high-speed predecoding address counter circuit comprising at least three tetrad counters connected in series, each for inputting an external 4-bit address decoding signal in response to a set signal and cyclically shifting a logic signal with a specific logic value at its four output terminals in response to a clock signal, a first clock switching unit responsive to a logical value of a most significant bit of an output signal from a lowest-order one of the at least three tetrad counters, for transferring the clock signal to a higher-order one of at least three tetrad counters, at least one logic unit for detecting whether both most significant bits of output signals from at least two lower-order ones of the at least three tetrad counters have the specific logic value, and at least one second clock switching unit connected between at least one logic unit and at least one of the at least three tetrad counters other than the at least two lower-order tetrad counters, for switching the clock signal to the at least one tetrad counter in response to an output signal from at least one logic unit. According to the present invention, because of a minimized propagation delay time, the address counter circuit generates internal address signals with a high-speed response characteristic with respect to the clock signal.

6 Claims, 8 Drawing Sheets

5,799,053

HIGH-SPEED PREDECODING ADDRESS COUNTER CIRCUIT

BACKGROUND OF THE INVENTION

1. Field of the Invention

The present invention relates in general to an address counter circuit which is used in a semiconductor memory device to generate internal addresses for designating memory cells in the semiconductor memory device, and more particularly to a high-speed predecoding address counter circuit which is operable in response to a clock signal of high frequency.

2. Description of the Prior Art

Generally, addresses are used to select memory cells in a memory device. An input address is decoded in the memory device to access a corresponding memory cell in the memory device. Namely, a part of bits of the input address are first decoded to select a row of a memory cell array and the remaining input address bits are then decoded to select a column of the memory cell array.

An internal address counter circuit is provided in the memory device to allow the memory device to perform self-refresh and page access operations. The internal address counter circuit requires a high operation speed according to the high integration, low operating voltage and fast operation of the memory device. However, such a conventional internal address counter circuit has a difficulty in performing the high-speed operation, due to a propagation delay time increased with an increase in the number of address bits. Such a problem with the conventional internal address counter circuit will hereinafter be described in detail with reference to FIGS. 1 to 3.

FIG. 1 is a circuit diagram illustrating the construction of a conventional internal address counter circuit which is a synchronous address counter circuit. As shown in this drawing, the conventional internal address counter circuit comprises first to eighth binary bit counters 10-24 each for inputting a corresponding one of external 1-bit address signals EXT_A0-EXT_A7 when a set signal SET is high in logic, and first to sixth logic units 26-36 for performing logic operations with respect to output signals A0-A6 from the first to seventh binary bit counters 10-22.

The first logic unit 26 detects whether the output signals A0 and A1 from the first and second binary bit counters 10 and 12 are both "1" in logic. To this end, the first logic unit 26 includes one NAND gate G1 and one inverter I1. Only when the output signals A0 and A1 from the first and second binary bit counters 10 and 12 are both "1" in logic, the first logic unit 26 generates a first logic detection signal A1' which is "1" in logic.

Similarly, the second logic unit 28 generates a second logic detection signal A2' which is "1" in logic, when the output signals A0-A2 from the first to third binary bit counters 10-14 are all "1" in logic. The third logic unit 30 generates a third logic detection signal A3' which is "1" in logic, when the output signals A0-A3 from the first to fourth binary bit counters 10-16 are all "1" in logic. The fourth logic unit 32 generates a fourth logic detection signal A4' which is "1", in logic, when the output signals A0-A4 from the first to fifth binary bit counters 10-18 are all "1" in logic. The fifth logic unit 34 generates a fifth logic detection signal A5' which is "1" in logic, when the output signals A0-A5 from the first to sixth binary bit counters 10-20 are all "1" in logic. The sixth logic unit 36 generates a sixth logic detection signal A6' which is "1" in logic, when the output signals A0-A6 from the first to seventh binary bit counters 10-22 are all "1" in logic.

To this end, the second logic unit 28 includes two NAND gates G1 and G2 and two inverters I1 and I2. The third logic unit 30 includes three NAND gates G1-G3 and three inverters I1-I3. The fourth logic unit 32 includes four NAND gates G1-G4 and four inverters I1-I4. The fifth logic unit 34 includes five NAND gates G1-G5 and five inverters I1-I5. The sixth logic unit 36 includes six NAND gates G1-G6 and six inverters I1-I6.

The conventional internal address counter circuit further comprises first to eighth clock switching units 38-52 each for switching a clock signal CLK to a corresponding one of the first to eighth binary bit counters 10-24.

The first clock switching unit 38 transfers the clock signal CLK to a clock terminal of the first binary bit counter 10 when it receives a supply voltage from a supply voltage source VDD. The second clock switching unit 40 transfers the clock signal CLK to a clock terminal of the second binary bit counter 12 when the output signal A0 from the first binary bit counter 10 is high in logic. The third clock switching unit 42 transfers the clock signal CLK to a clock terminal of the third binary bit counter 14 when the first logic detection signal A1' from the first logic unit 26 is "1" in logic.

Similarly, the fourth clock switching unit 44 transfers the clock signal CLK to a clock terminal of the fourth binary bit counter 16 when the second logic detection signal A2' from the second logic unit 28 is "1" in logic. The fifth clock switching unit 46 transfers the clock signal CLK to a clock terminal of the fifth binary bit counter 18 when the third logic detection signal A3' from the third logic unit 30 is "1" in logic. The sixth clock switching unit 48 transfers the clock signal CLK to a clock terminal of the sixth binary bit counter 20 when the fourth logic detection signal A4' from the fourth logic unit 32 is "1" in logic. The seventh clock switching unit 50 transfers the clock signal CLK to a clock terminal of the seventh binary bit counter 22 when the fifth logic detection signal A5' from the fifth logic unit 34 is "1" in logic. The eighth clock switching unit 52 transfers the clock signal CLK to a clock terminal of the eighth binary bit counter 24 when the sixth logic detection signal A6' from the sixth logic unit 36 is "1" in logic.

To this end, each of the first to eighth clock switching units 38-52 includes one NAND gate G7, G8, G9, G10, G11, G12, G13 or G14 and one inverter I7, I8, I9, I10, I11, I12, I13 or I14.

Each of the first to eighth binary bit counters 10-24 inverts a logic value of its output signal A0, A1, A2, A3, A4, A5, A6 or A7 whenever it receives the clock signal CLK at its clock terminal. The output signals A0-A7 from the first to eighth binary bit counters 10-24 and the first to sixth logic detection signals A1'-A6' from the first to sixth logic units 26-36 respond to the clock signal CLK after they are delayed by a propagation delay time of the circuit elements, as shown in FIG. 2.

FIG. 2 is a timing diagram illustrating the operation of the conventional internal address counter circuit in FIG. 1. As shown in this drawing, the output signals A0-A7 from the first to eighth binary bit counters 10-24 are simultaneously varied after the lapse of a predetermined time period from a rising edge of the clock signal CLK. However, the first to sixth logic detection signals A1'-A6' from the first to sixth logic units 26-36 sequentially respond to the clock signal CLK at an interval of a predetermined time period from a response time point of the output signals A0-A7 from the first to eighth binary bit counters 10-24.

FIG. 3 is a detailed circuit diagram illustrating the construction of each of the first to eighth binary bit counters 10–24 in FIG. 1. As shown in this drawing, the binary bit counter includes an inverter I15 for inverting the external 1-bit address signal EXT_An from an input terminal, first NMOS and PMOS transistors MN1 and MP1 connected in parallel between an output terminal of the inverter I15 and a first node N1, an inverter I16 for inverting the set signal SET from a set terminal and outputting the inverted set signal /SET, and an inverter I17 for inverting the clock signal CLK from the clock terminal and outputting the inverted clock signal /CLK.

The first NMOS transistor MN1 has its gate for inputting the set signal SET from the set terminal. When the set signal SET from the set terminal is high in logic, the first NMOS transistor MN1 is turned on to transfer an output signal from the inverter I15 to the first node N1. The first PMOS transistor MP1 has its gate for inputting the inverted set signal /SET from the inverter I16. When the inverted set signal /SET from the inverter I16 is low in logic, the first PMOS transistor MP1 is turned on simultaneously with the first NMOS transistor MN1 to transfer the output signal from the is inverter I15 to the first node N1.

The binary bit counter further includes two inverters I18 and I19 connected in parallel between the first node N1 and a second node N2 to form a cyclic loop, two inverters I20 and I21 connected in parallel between third and fourth nodes N3 and N4 to form a cyclic loop, and second NMOS and PMOS transistors MN2 and MP2 connected in parallel between the second and third nodes N2 and N3.

The inverter I19 has its true control terminal for inputting the clock signal CLK from the clock terminal and its complementary control terminal for inputting the inverted clock signal /CLK from the inverter I17. In response to the clock signal CLK from the clock terminal and the inverted clock signal /CLK from the inverter I17, the inverter I19 is driven while the clock signal CLK is low in logic. At this time, the inverter I19 functions as a storage element together with the inverter I18 to hold a logic value at the first node N1. To the contrary, while the clock signal CLK from the clock terminal is high in logic, the inverter I18 inverts the logic value at the first node N1 and transfers the inverted logic value to the second node N2.

The second NMOS transistor MN2 has its gate for inputting the inverted clock signal /CLK from the inverter I17. When the inverted clock signal /CLK from the inverter I17 is high in logic, the second NMOS transistor MN2 is turned on to transfer a logic value at the second node N2 to the third node N3. The second PMOS transistor MP2 has its gate for inputting the clock signal CLK from the clock terminal. When the clock signal CLK from the clock terminal is low in logic, the second PMOS transistor MP2 is turned on simultaneously with the second NMOS transistor MN2 to transfer the logic value at the second node N2 to the third node N3.

The inverter I21 has its true control terminal for inputting the inverted clock signal /CLK from the inverter I17 and its complementary control terminal for inputting the clock signal CLK from the clock terminal. In response to the clock signal CLK from the clock terminal and the inverted clock signal /CLK from the inverter I17, the inverter I21 is driven while the clock signal CLK is high in logic. At this time, the inverter I21 functions as a storage element together with the inverter I20 to hold a logic value at the third node N3. The inverter I20 inverts the logic value at the third node N3 and transfers the inverted logic value to the fourth node N4.

The binary bit counter further includes an inverter I22 connected between the fourth node N4 and an output terminal AN, and an inverter I23 connected between the fourth and first nodes N4 and N1.

The inverter I22 inverts a logic value at the fourth node N4 and transfers the inverted logic value to the output terminal AN.

The inverter I23 has its true control terminal for inputting the inverted clock signal /CLK from the inverter I17 and its complementary control terminal for inputting the clock signal CLK from the clock terminal. In response to the clock signal CLK from the clock terminal and the inverted clock signal /CLK from the inverter I17, the inverter I23 is driven while the clock signal CLK is high in logic. At this time, the inverter I23 inverts the logic value at the fourth node N4 and transfers the inverted logic value to the first node N1.

As mentioned above, in the conventional internal address counter circuit, the output signals from the lower-order binary bit counters must be decoded through multiple stages according to an increase in the number of address bits. For this reason, the conventional internal address counter circuit is excessively delayed in its counting operation, so that it cannot rapidly respond to the clock signal.

SUMMARY OF THE INVENTION

Therefore, the present invention has been made in view of the above problem, and it is an object of the present invention to provide a high-speed predecoding address counter circuit for minimizing a propagation delay time to generate an internal address with a high-speed response characteristic with respect to a clock signal.

In accordance with the present invention, the above and other objects can be accomplished by a provision of a high-speed predecoding address counter circuit comprising at least three tetrad counters connected in series, each for inputting an external 4-bit address decoding signal in response to a set signal and cyclically shifting a logic signal with a specific logic value at its four output terminals in response to a clock signal; first clock switching means responsive to a logical value of a most significant bit of an output signal from a lowest-order one of the at least three tetrad counters, for transferring the clock signal to a higher-order one of the at least three tetrad counters; at least one logic means for detecting whether both most significant bits of output signals from at least two lower-order ones of the at least three tetrad counters have the specific logic value; and at least one second clock switching means connected between the at least one logic means and at least one of the at least three tetrad counters other than the at least two lower-order tetrad counters, for switching the clock signal to the at least one tetrad counter in response to an output signal from the at least one logic means.

BRIEF DESCRIPTION OF THE DRAWINGS

The above and other objects, features and advantages of the present invention will be more clearly understood from the following detailed description taken in conjunction with the accompany drawings, in which.

DETAILED DESCRIPTION OF THE PREFERRED EMBODIMENTS

Figure 1:
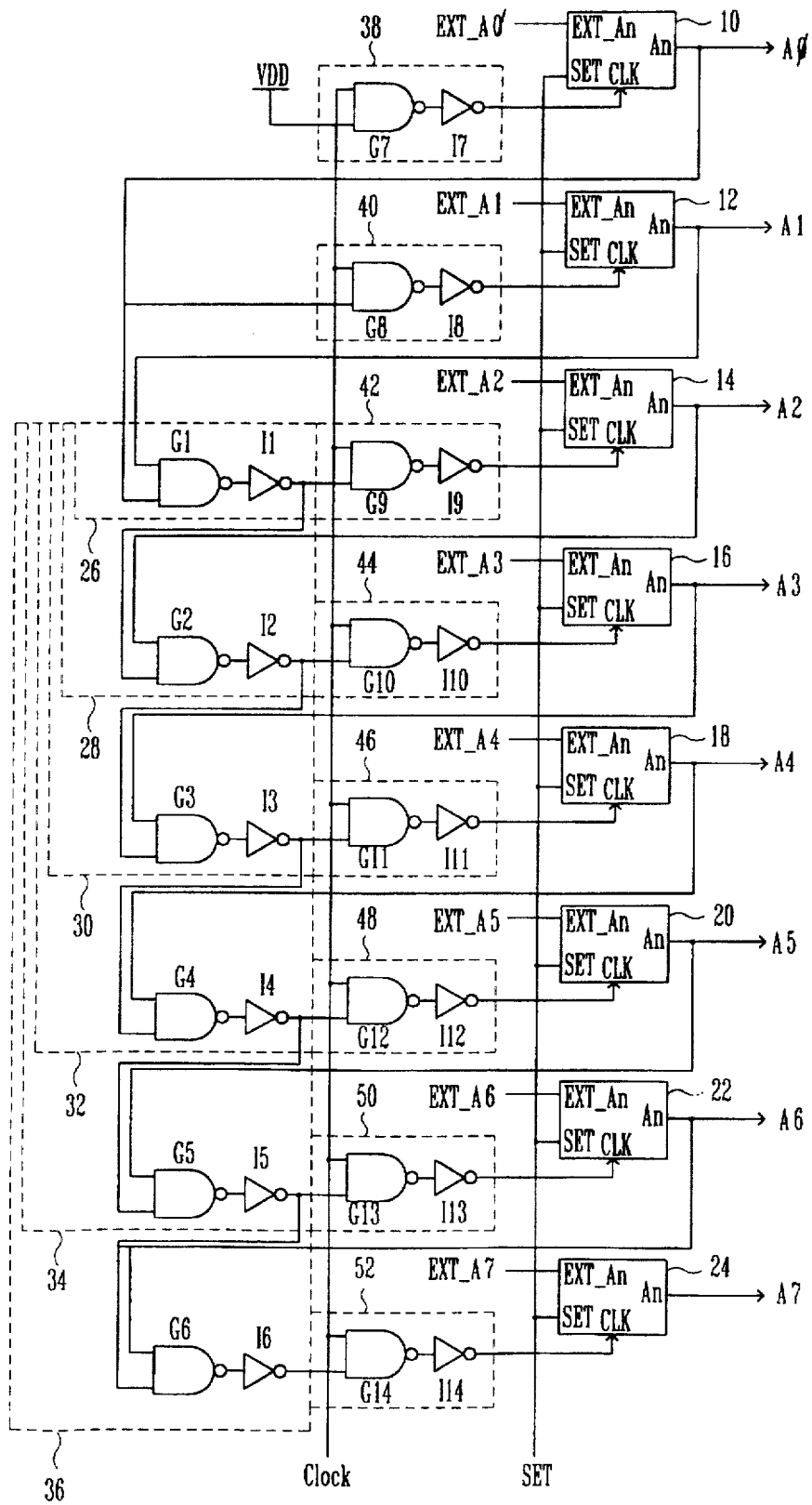
FIG. 1 is a circuit diagram illustrating the construction of a conventional synchronous address counter circuit.
Figure 2:
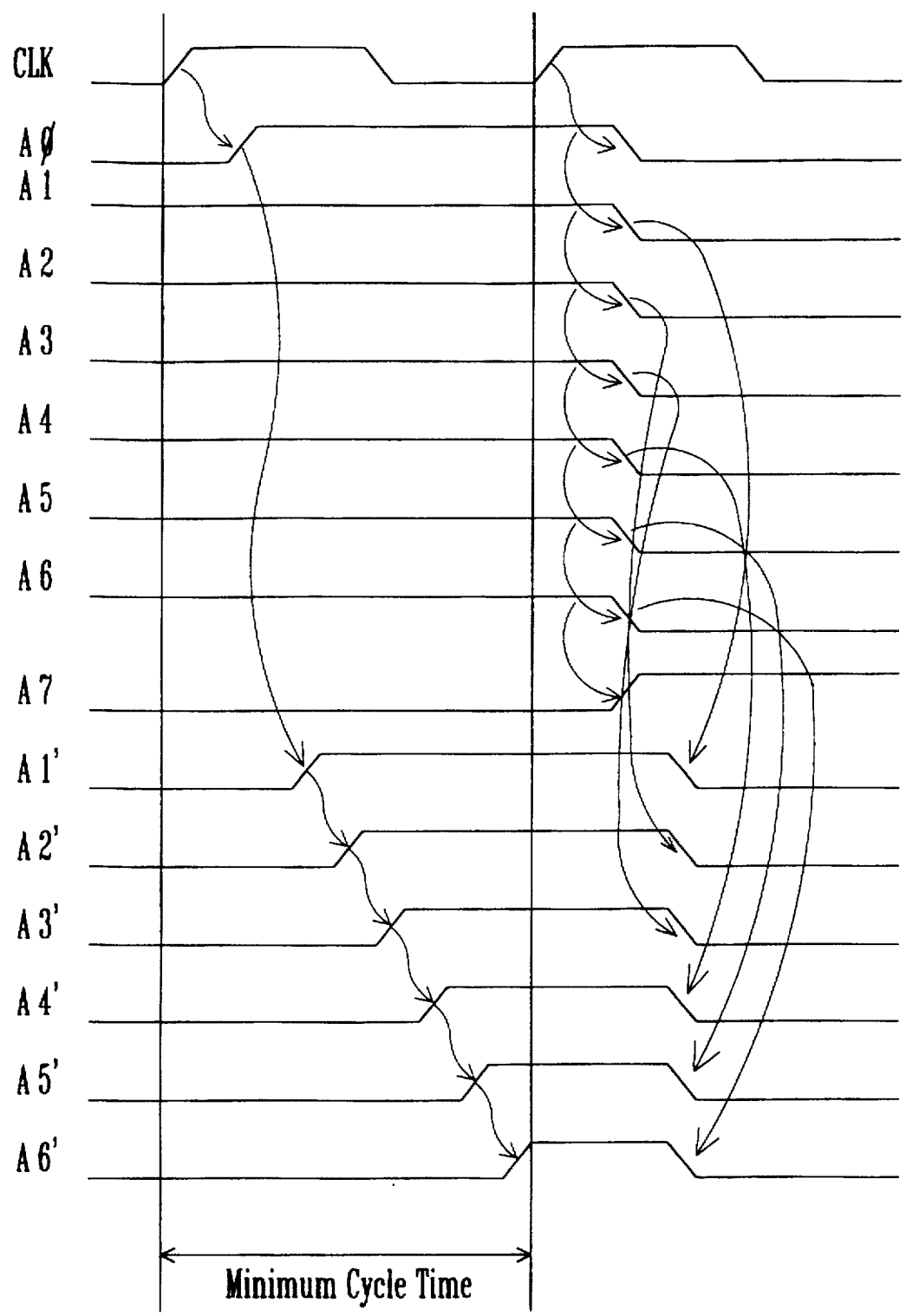
FIG. 2 is a timing diagram illustrating the operation of the conventional synchronous address counter circuit in FIG. 1.
Figure 3:
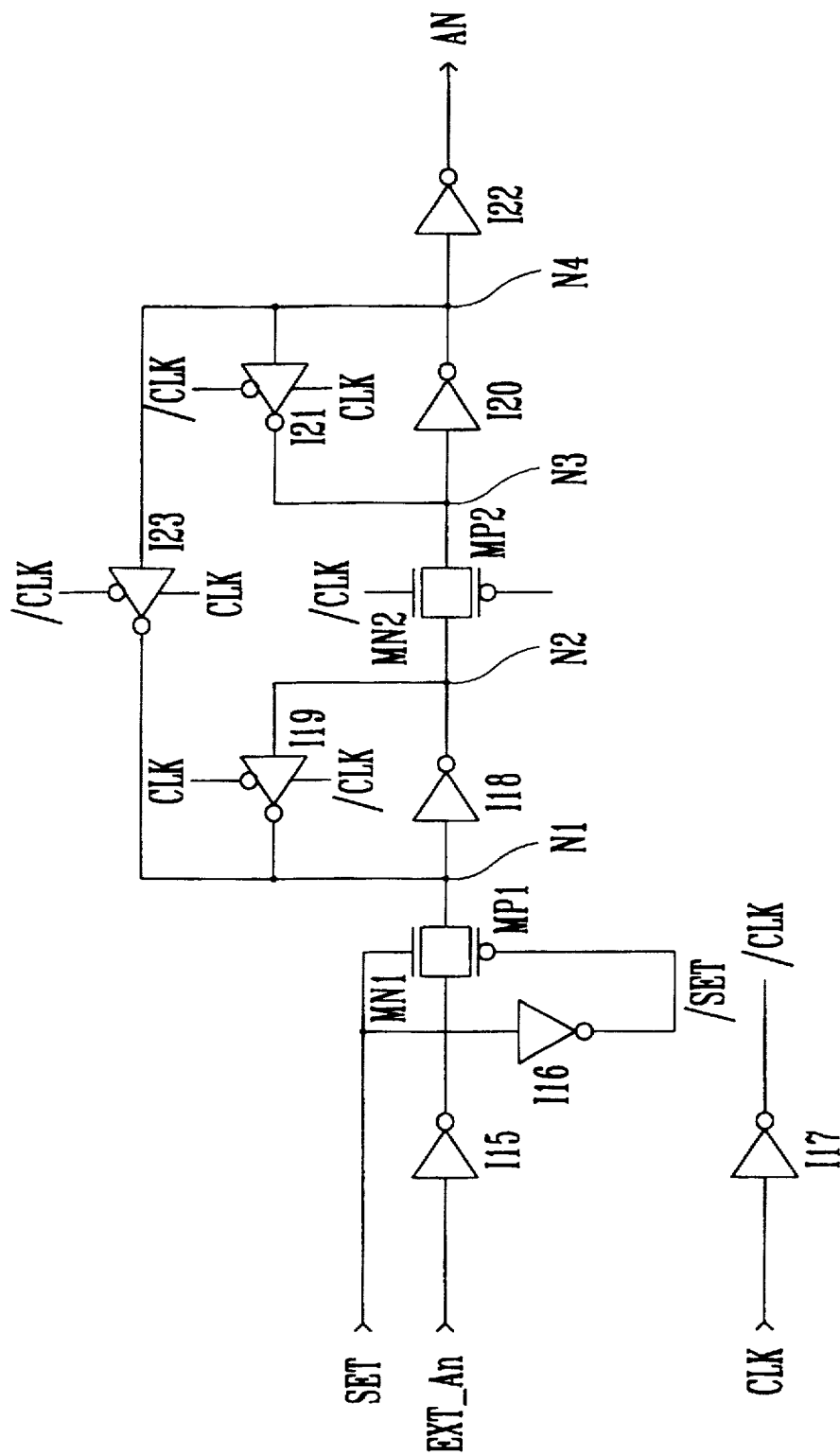
FIG. 3 is a detailed circuit diagram illustrating the construction of a binary bit counter in FIG. 1.
Figure 4:
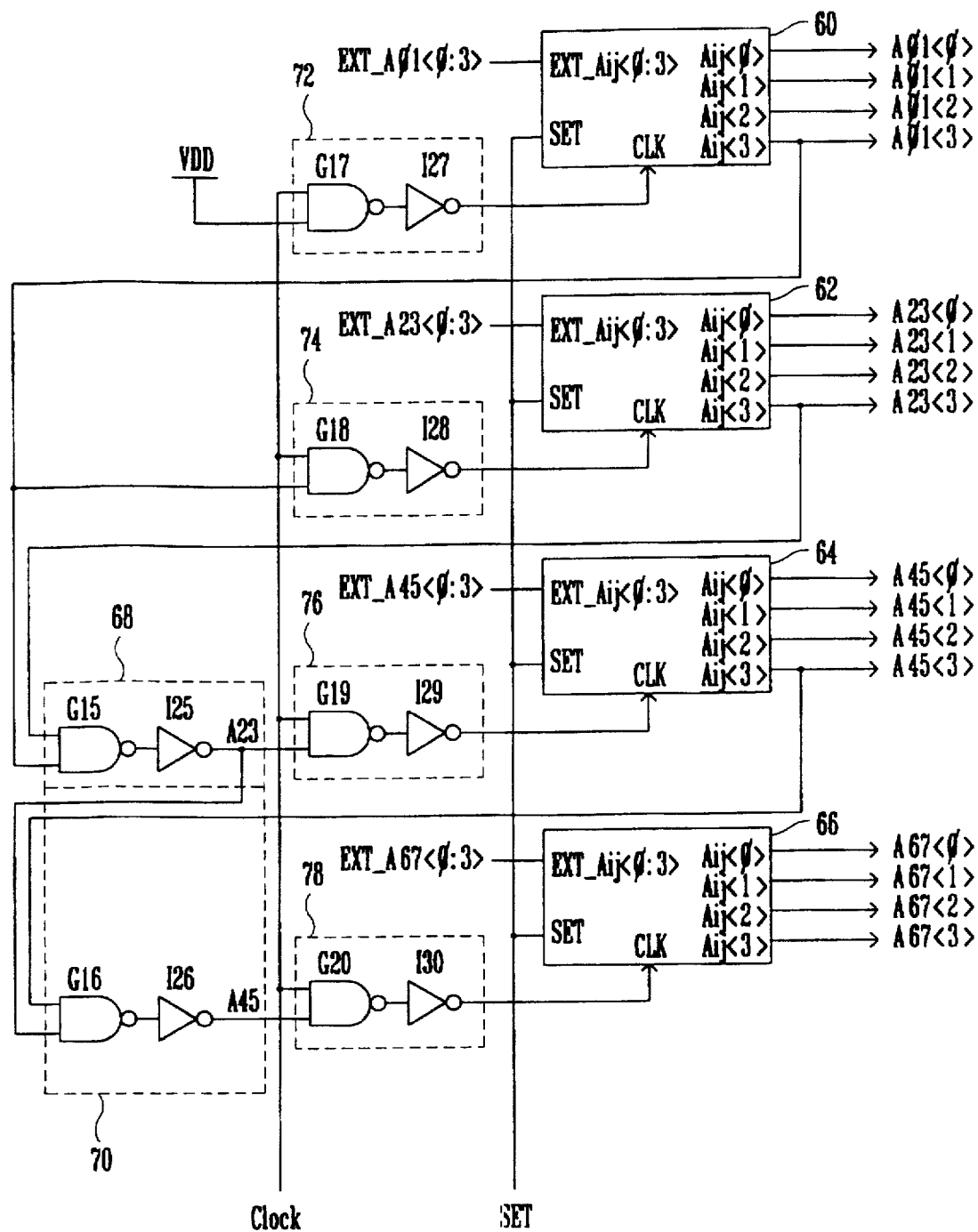
FIG. 4 is a circuit diagram illustrating the construction of a high-speed predecoding address counter circuit in accordance with an embodiment of the present invention.

FIG. 4 is a circuit diagram illustrating the construction of a high-speed predecoding address counter circuit in accordance with an embodiment of the present invention. As shown in this drawing, the high-speed predecoding address counter circuit comprises first to fourth tetrad counters 60–66 each for inputting an external 4-bit address decoding signal EXT__A010-EXT__A013, EXT__A230-EXT__A233, EXT__A450-EXT__A453 or EXT__A670-EXT__A673 when a set signal SET is high in logic, and first and second logic units 68 and 70 for performing logic operations with respect to most significant bits A013–A453 of output signals A010–A013, A230–A233 and A450–A453 from the first to third tetrad counters 60–64.

The first logic unit 68 detects whether the most significant bits A013 and A233 of the output signals A010–A013 and A230–A233 from the first and second tetrad counters 60 and 62 are both "1" in logic. To this end, the first logic unit 68 includes one NAND gate G15 and one inverter I25. Only when the most significant bits A013 and A233 of the output signals A010–A013 and A230–A233 from the first and second tetrad counters 60 and 62 are both "1" in logic, the first logic unit 68 generates a first logic detection signal A23' which is "1" in logic.

Similarly, the second logic unit 70 generates a second logic detection signal A25' which is "1" in logic, when the most significant bits A013–A453 of the output signals A010–A013, A230–A233 and A450–A453 from the first to third tetrad counters 60–64 are all "1" in logic. To this end, the second logic unit 70 includes two NAND gates G15 and G16 and two inverters I25 and I26.

The high-speed predecoding address counter circuit further comprises first to fourth clock switching units 72–78 each for switching a clock signal CLK to a corresponding one of the first to fourth tetrad counters 60–66.

The first clock switching unit 72 transfers the clock signal CLK to a clock terminal of the first tetrad counter 60 when it receives a supply voltage from a supply voltage source VDD. The second clock switching unit 74 transfers the clock signal CLK to a clock terminal of the second tetrad counter 62 when the most significant bit A013 of the output signal A010–A013 from the first tetrad counter 60 is high in logic. The third clock switching unit 76 transfers the clock signal CLK to a clock terminal of the third tetrad counter 64 when the first logic detection signal A23' from the first logic unit 68 is "1" in logic.

Similarly, the fourth clock switching unit 78 transfers the clock signal CLK to a clock terminal of the fourth tetrad counter 66 when the second logic detection signal A45' from the second logic unit 70 is "1" in logic. To this end, each of the first to fourth clock switching units 72–78 includes one NAND gate G17, G18, G19 or G20 and one inverter I27, I28, I29 or I30.

Each of the first to fourth tetrad counters 60–66 shifts a high logic signal from one of its four output terminals A010–A013, A230–A233, A450–A453 or A670–A673 to the higher-order output terminal whenever it receives the clock signal CLK at its clock terminal. The output signals A010–A013, A230–A233, A450–A453 and A670–A673 from the first to fourth tetrad counters 60–66 and the first and second logic detection signals A23' and A45' from the first and second logic units 68 and 70 respond to the clock signal CLK after they are delayed by a propagation delay time of the circuit elements, as shown in FIG. 5.

Figure 5:
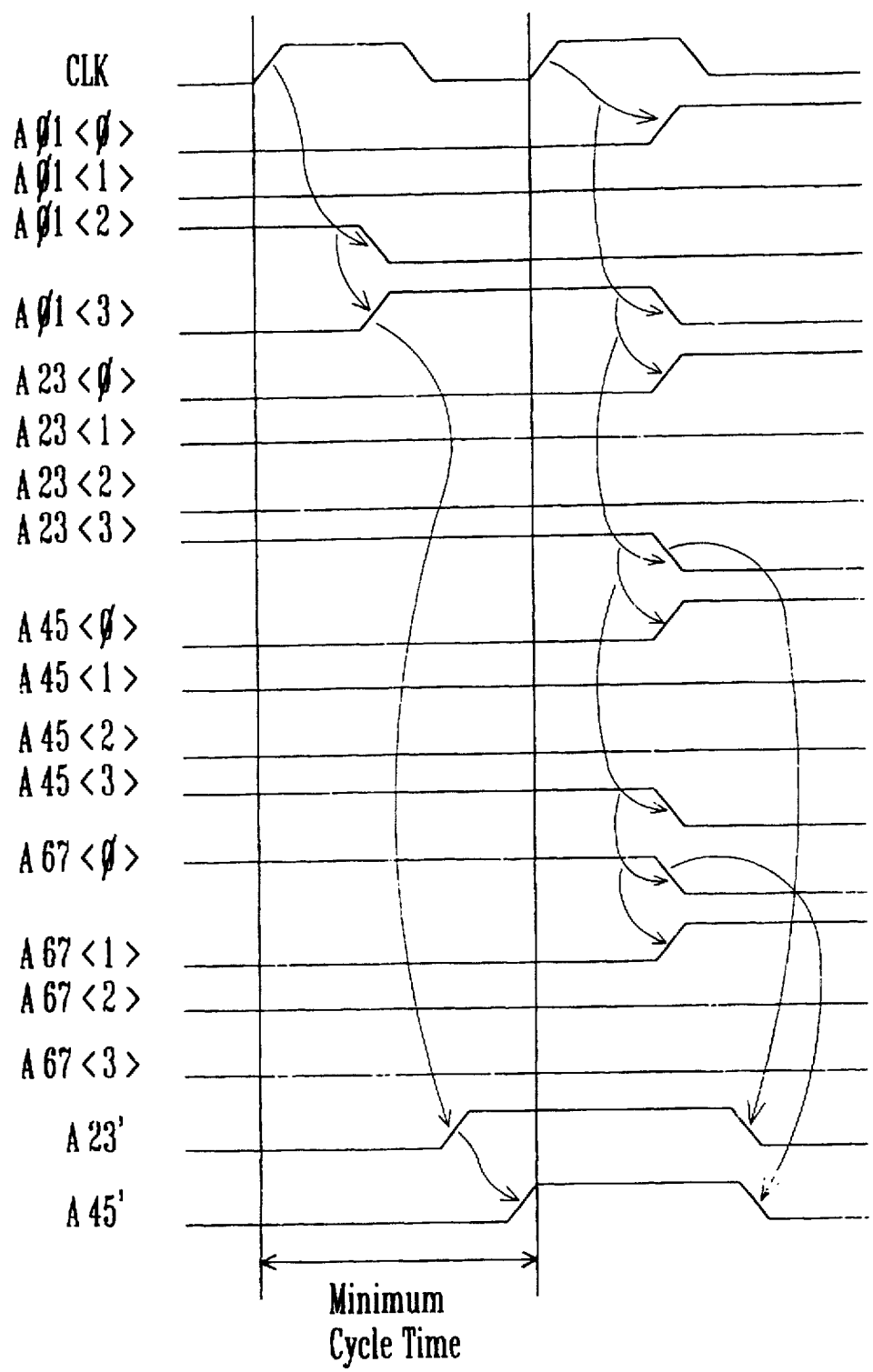
FIG. 5 is a timing diagram illustrating the operation of the high-speed predecoding address counter circuit in FIG. 4.

FIG. 5 is a timing diagram illustrating the operation of the high-speed predecoding address counter circuit in FIG. 4. As shown in this drawing, the output signals A010–A013, A230–A233, A450–A453 and A670–A673 from the first to fourth tetrad counters 60–66 are simultaneously varied after the lapse of a predetermined time period from a rising edge of the clock signal CLK. Also, the first and second logic detection signals A23' and A45' from the first and second logic units 68 and 70 sequentially respond to the clock signal CLK at an interval of predetermined time period from a response time point of the output signals A010–A013, A230–A233, A450–A453 and A670–A673 from the first to fourth tetrad counters 60–66. However, because of the minimized number of logic units for the decoding operation, the high-speed predecoding address counter circuit can minimize its propagation delay time, thereby allowing the generated, predecoded internal address signals A010–A013, A230–A233, A450–A453 and A670–A673 to have a high-speed response characteristic with respect to the clock signal CLK. Therefore, the high-speed predecoding address counter circuit of the present invention allows a semiconductor memory device to perform an access operation at high speed.

Figure 6:
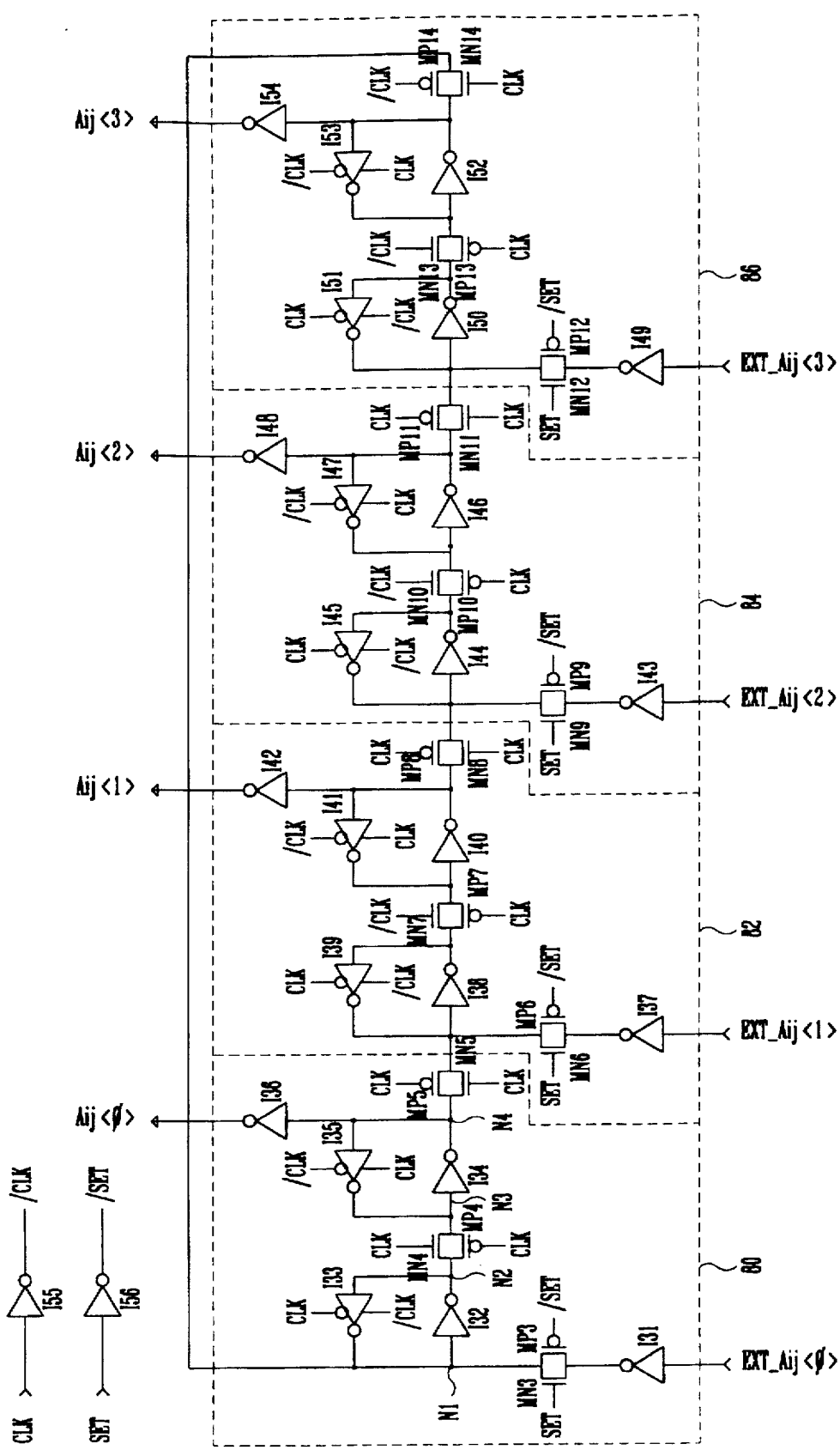
FIG. 6 is a detailed circuit diagram illustrating the construction of a tetrad counter in FIG. 4.

FIG. 6 is a detailed circuit diagram illustrating the construction of each of the first to fourth tetrad counters 60–66 in FIG. 4. As shown in this drawing, the tetrad counter includes an inverter I55 for inverting the clock signal CLK from the clock terminal and outputting the inverted clock signal /CLK, an inverter I56 for inverting the set signal SET from a set terminal and outputting the inverted set signal /SET, and first to fourth latch circuits 80–86 connected to form a cyclic loop. Each of the first to fourth latch circuits 80–86 is adapted to input a corresponding one of the four bits of the external 4-bit address decoding signal EXT__Aij0-EXT__Aij3. Namely, when the set signal SET from the set terminal is high in logic, each of the first to fourth latch circuits 80–86 inputs the corresponding bit of the external 4-bit address decoding signal EXT__Aij0-EXT__Aij3. Also, each of the first to fourth latch circuits 80–86 shifts its output logic value to the higher-order latch circuit whenever it receives the clock signal CLK from the clock terminal.

The first latch circuit 80 includes an inverter I31 for inverting the corresponding bit EXT__Aij0 of the external 4-bit address decoding signal EXT__Aij0-EXT__Aij3, and first NMOS and PMOS transistors MN3 and MP3 connected in parallel between an output terminal of the inverter I31 and a first node N1.

The first NMOS transistor MN3 has its gate for inputting the set signal SET from the set terminal. When the set signal SET from the set terminal is high in logic, the first NMOS transistor MN3 is turned on to transfer an output signal from the inverter I31 to the first node N1. The first PMOS transistor MP3 has its gate for inputting the inverted set signal /SET from the inverter I56. When the inverted set signal /SET from the inverter I56 is low in logic, the first PMOS transistor MP3 is turned on simultaneously with the first NMOS transistor MN3 to transfer the output signal from the inverter I31 to the first node N1.

The first latch circuit 80 further includes two inverters I32 and I33 connected in parallel between the first node N1 and a second node N2 to form a cyclic loop, two inverters I34 and I35 connected in parallel between third and fourth nodes N3 and N4 to form a cyclic loop, and second NMOS and PMOS transistors MN4 and MP4 connected in parallel between the second and third nodes N2 and N3.

The inverter I33 has its true control terminal for inputting the clock signal CLK from the clock terminal and its complementary control terminal for inputting the inverted clock signal /CLK from the inverter I55. In response to the clock signal CLK from the clock terminal and the inverted clock signal /CLK from the inverter I55, the inverter I33 is driven while the clock signal CLK is low in logic. At this time, the inverter I33 functions as a storage element together with the inverter I32 to hold a logic value at the first node N1. In contrast, while the clock signal CLK from the clock terminal is high in logic, the inverter I32 inverts the logic value at the first node N1 and transfers the inverted logic value to the second node N2. The first node N1 is also connected to NMOS and PMOS transistors MN14 and MP14 in the fourth latch circuit 86.

The second NMOS transistor MN4 has its gate for inputting the inverted clock signal /CLK from the inverter I55. When the inverted clock signal /CLK from the inverter I55 is high in logic, the second NMOS transistor MN4 is turned on to transfer a logic value at the second node N2 to the third node N3. The second PMOS transistor MP4 has its gate for inputting the clock signal CLK from the clock terminal. When the clock signal CLK from the clock terminal is low in logic, the second PMOS transistor MP4 is turned on simultaneously with the second NMOS transistor MN4 to transfer the logic value at the second node N2 to the third node N3.

The inverter I35 has its true control terminal for inputting the inverted clock signal /CLK from the inverter I55 and its complementary control terminal for inputting the clock signal CLK from the clock terminal. In response to the clock signal CLK from the clock terminal and the inverted clock signal /CLK from the inverter I55, the inverter I35 is driven while the clock signal CLK is high in logic. At this time, the inverter I35 functions as a storage element together with the inverter I34 to hold a logic value at the third node N3. The inverter I34 inverts the logic value at the third node N3 and transfers the inverted logic value to the fourth node N4.

The first latch circuit 80 further includes third NMOS and PMOS transistors MN5 and MP5 connected in parallel between the fourth node N4 and a first inverter cyclic loop I38 and I39 of the second latch circuit 82 functioning as a storage element, and an inverter I36 connected between the fourth node N4 and a first output terminal Aij0.

The inverter I36 inverts a logic value at the fourth node N4 and transfers the inverted logic value to the first output terminal Aij0. The third PMOS transistor MP5 has its gate for inputting the inverted clock signal /CLK from the inverter I55. When the inverted clock signal /CLK from the inverter I55 is low in logic, the third PMOS transistor MP5 is turned on to transfer the logic value at the fourth node N4 to the first inverter cyclic loop I38 and I39 of the second latch circuit 82. The third NMOS transistor MN5 has its gate for inputting the clock signal CLK from the clock terminal. When the clock signal CLK from the clock terminal is high in logic, the third NMOS transistor MN5 is turned on simultaneously with the third PMOS transistor MP5 to transfer the logic value at the fourth node N4 to the first inverter cyclic loop I38 and I39 of the second latch circuit 82.

The second to fourth latch circuits 82–86 are the same in construction and operation as the first latch circuit 80 and a description thereof will thus be omitted.

Figure 7:
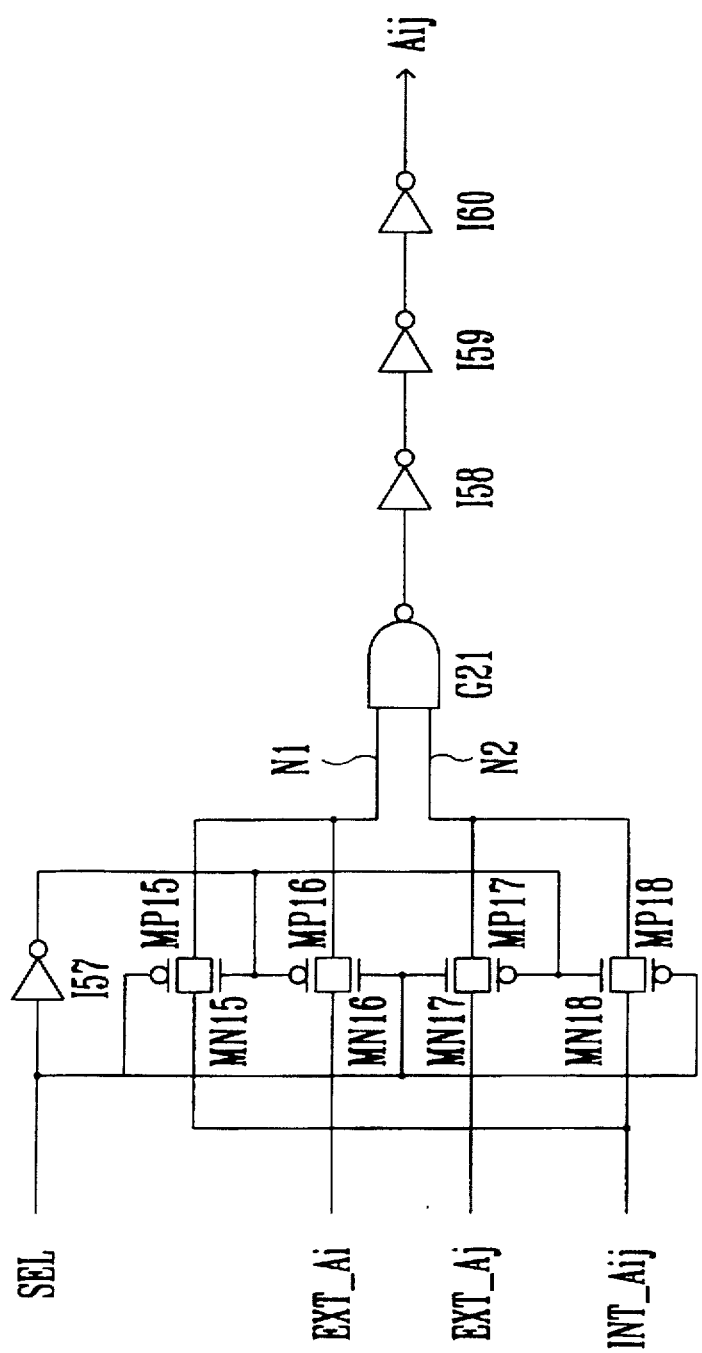
FIG. 7 is a circuit diagram illustrating the construction of an address selection circuit in accordance with the embodiment of the present invention.

FIG. 7 is a circuit diagram illustrating the construction of an address selection circuit in accordance with the embodiment of the present invention. The address selection circuit is adapted to selectively output external and internal address signals. As shown in FIG. 7, the address selection circuit comprises an inverter I57 for inverting a selection signal SEL and outputting the inverted selection signal /SEL, NMOS and PMOS transistors MN15 and MP15 connected in parallel between an internal address input terminal INT_Aij and a first node N1, and NMOS and PMOS transistors MN18 and MP18 connected in parallel between the internal address input terminal INT_Aij and a second node N2. The internal address input terminal INT_Aij is adapted to input the predecoded internal address signals A010–A013, A230–A233, A450–A453 and A670–A673 from the first to fourth tetrad counters 60–66 in FIGS. 4 and 6.

The NMOS transistor MN15 has its gate for inputting the inverted selection signal /SEL from the inverter I57. When the inverted selection signal /SEL from the inverter I57 is high in logic, the NMOS transistor MN15 is turned on to transfer an internal address signal at the internal address input terminal INT_Aij to the first node N1. The PMOS transistor MP15 has its gate for inputting the selection signal SEL. When the selection signal SEL is low in logic, the PMOS transistor MP15 is turned on simultaneously with the NMOS transistor MN15 to transfer the internal address signal at the internal address input terminal INT_Aij to the first node N1.

The NMOS transistor MN18 has its gate for inputting the inverted selection signal /SEL from the inverter I57. When the inverted selection signal /SEL from the inverter I57 is high in logic, the NMOS transistor MN18 is turned on to transfer the internal address signal at the internal address input terminal INT_Aij to the second node N2. The PMOS transistor MP18 has its gate for inputting the selection signal SEL. When the selection signal SEL is low in logic, the PMOS transistor MP18 is turned on simultaneously with the NMOS transistor MN18 to transfer the internal address signal at the internal address input terminal INT_Aij to the second node N2.

The address selection circuit further comprises NMOS and PMOS transistors MN16 and MP16 connected in parallel between a first external address input terminal EXT_Ai and the first node N1, and NMOS and PMOS transistors MN17 and MP17 connected in parallel between a second external address input terminal EXT_Aj and the second node N2. The first and second external address input terminals EXT_Ai and EXT_Aj are adapted to input first and second external address signals, not decoded, which may be partially or completely inverted in their bit values by inverters as needed.

The NMOS transistor MN16 has its gate for inputting the selection signal SEL. When the selection signal SEL is high in logic, the NMOS transistor MN16 is turned on to transfer the first external address signal at the first external address input terminal EXT_Ai to the first node N1. The PMOS transistor MP16 has its gate for inputting the inverted selection signal /SEL from the inverter I57. When the inverted selection signal /SEL from the inverter I57 is low in logic, the PMOS transistor MP16 is turned on simultaneously with the NMOS transistor MN16 to transfer the first external address signal at the first external address input terminal EXT_Ai to the first node N1.

The NMOS transistor MN17 has its gate for inputting the selection signal SEL. When the selection signal SEL is high in logic, the NMOS transistor MN17 is turned on to transfer the second external address signal at the second external address input terminal EXT__Aj to the second node N2. The PMOS transistor MP17 has its gate for inputting the inverted selection signal /SEL from the inverter I57. When the inverted selection signal /SEL from the inverter I57 is low in logic, the PMOS transistor MP17 is turned on simultaneously with the NMOS transistor MN17 to transfer the second external address signal at the second external address input terminal EXT__Aj to the second node N2.

The address selection circuit further comprises a NAND gate G21 for inputting address signals at the first and second nodes N1 and N2, and three inverters I58–I60 connected in series to an output terminal of the NAND gate G21. Only when the address signals at the first and second nodes N1 and N2 are both high in logic does the NAND gate G21 generates a predecoded address signal which is low in logic. The inverter series circuit I58–I60 inverts and delays an output signal from the NAND gate G21 to generate a decoded address signal Aij which is then supplied to a control circuit of a semiconductor memory device. The first and second external address signals EXT__Ai and EXT__Aj, the internal address signals INT__Aij. In addition, the decoded address signal Aij have waveforms as shown in FIG. 8.

Figure 8:
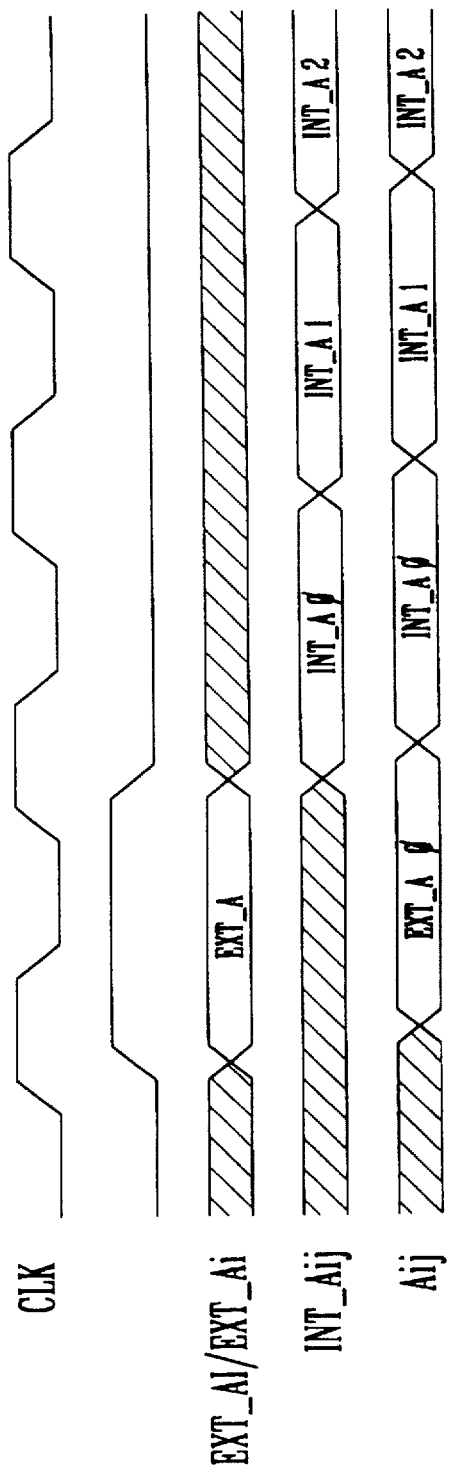
FIG. 8 is a timing diagram illustrating the operation of the address selection circuit in FIG. 7.

FIG. 8 is a timing diagram illustrating the operation of the address selection circuit in FIG. 7. As shown in this drawing, the first and second external address signals EXT__Ai and EXT__Aj and the internal address signals INT__Aij are selectively outputted as the decoded address signal Aij according to a logic state of the selection signal SEL. At this time, the first and second external address signals EXT__Ai and EXT__Aj are decoded. Also, the decoded address signal Aij has a high-speed response characteristic with respect to the clock signal CLK which is supplied to the internal address counter.

As is apparent from the above description, according to the present invention, the high-speed predecoding address counter circuit can minimize its decoding procedure and propagation delay time by using the tetrad counters. Therefore, the high-speed predecoding address counter circuit can generate the internal address signal with a high-speed response characteristic with respect to the clock signal. Also, the high-speed predecoding address counter circuit generates the predecoded internal address signal to remove an address decoding operation of a semiconductor memory device. Therefore, the high-speed predecoding address counter circuit allows the semiconductor memory device to perform an access operation at high speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, octal counters may be used instead of the tetrad counters in FIG. 4 to reduce the number of logic and clock switching units.

What is claimed is:

1. A high-speed predecoding address counter circuit comprising:

at least three tetrad counters connected in series, each for inputting an external 4-bit address decoding signal in response to a set signal and cyclically shifting a logic signal with a specific logic value at its four output terminals in response to a clock signal;

first clock switching means responsive to a logical value of a most significant bit of an output signal from a lowest-order one of said at least three tetrad counters, for transferring said clock signal to a higher-order one of said at least three tetrad counters;

at least one logic means for detecting whether both most significant bits of output signals from at least two lower-order ones of said at least three tetrad counters have said specific logic value; and at least one second clock switching means connected between said at least one logic means and at least one of said at least three tetrad counters other than said at least two lower-order tetrad counters, for switching said clock signal to said at least one tetrad counter in response to an output signal from said at least one logic means.

2. A high-speed predecoding address counter circuit as set forth in claim 1, further comprising third clock switching means for switching said clock signal to said lowest-order tetrad counter in response to a supply voltage being applied thereto.

3. A high-speed predecoding address counter circuit as set forth in claim 1, wherein said at least one logic means is adapted to perform an AND operation.

4. A high-speed predecoding address counter circuit as set forth in claim 1, wherein said first clock switching means are adapted to perform an AND operation.

5. A high-speed predecoding address counter circuit as set forth in claim 1, further comprising a plurality of address switching means each for transferring a decoded address signal from a corresponding one of said at least three tetrad counters to a memory peripheral circuit or decoding an external 2-bit address signal and transferring the decoded address signal to said memory peripheral circuit.

6. A high-speed predecoding address counter circuit comprising:

at least three octal counters connected in series, each for inputting an external 8-bit address decoding signal in response to a set signal and cyclically shifting a logic signal with a specific logic value at its eight output terminals in response to a clock signal;

first clock switching means responsive to a logical value of a most significant bit of an output signal from a lowest-order one of said at least three octal counters, for transferring said clock signal to a higher-order one of said at least three octal counters;

at least one logic means for detecting whether both most significant bits of output signals from at least two lower-order ones of said at least three octal counters have said specific logic value; and at least one second clock switching means connected between said at least one logic means and at least one of said at least three octal counters other than said at least two lower-order octal counters, for switching said clock signal to said at least one octal counter in response to an output signal from said at least one logic means.

* * * * *